United States Patent
Sun et al.

(10) Patent No.: US 10,991,642 B2
(45) Date of Patent: Apr. 27, 2021

(54) INTEGRATED CIRCUIT, AND MOTOR DEVICE INCLUDING THE SAME

(71) Applicant: Johnson Electric International AG, Murten (CH)

(72) Inventors: Chiping Sun, Hong Kong (CN); Shinghin Yeung, Hong Kong (CN); Haibo Jiang, Shenzhen (CN); Qiubao Wang, Shenzhen (CN); Enhui Wang, Shenzhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 0 days.

(21) Appl. No.: 16/266,727

(22) Filed: Feb. 4, 2019

(65) Prior Publication Data

US 2019/0244880 A1 Aug. 8, 2019

(30) Foreign Application Priority Data

Feb. 2, 2018 (CN) .................. 2018 1 0107234.4

(51) Int. Cl.
*H01L 23/495* (2006.01)
*H03K 19/173* (2006.01)
(Continued)

(52) U.S. Cl.
CPC ............ *H01L 23/4951* (2013.01); *G06F 1/22* (2013.01); *H01L 23/50* (2013.01); *H01L 24/48* (2013.01);
(Continued)

(58) Field of Classification Search
CPC ........ H01L 23/50; H01L 23/4951; G06F 1/22
See application file for complete search history.

(56) References Cited

U.S. PATENT DOCUMENTS 6,366,131 B1 *  4/2002  Sharp ................. H03K 19/1732
                                                      326/101
2006/0123292 A1   6/2006  Bansal et al.
(Continued)

FOREIGN PATENT DOCUMENTS

JP      H03 201453      9/1991

OTHER PUBLICATIONS

Extended European Search Report dated Jul. 4, 2019 in connection with corresponding European application No. EP19154154.
(Continued)

*Primary Examiner* — Wael M Fahmy
*Assistant Examiner* — Sarah K Salerno
(74) *Attorney, Agent, or Firm* — Millman IP Inc.

(57) ABSTRACT

An IC includes a bare die and a multiplexed pin. The multiplexed pin is electrically connected to first and second switch circuits, the first and second switch circuits are respectively connected to first and second circuit modules disposed on the bare die and control a connection between the first and second circuit modules and the multiplexed pin, the first switch circuit is connected to a first die pad by a metal layer trace within the bare die, the second switch circuit is connected to a second die pad by a metal layer trace within the bare die, and the first and second die pads are connected to the multiplexed pin through a bond wire respectively. The bare die with a larger number of die pads can be packaged into an IC package with a smaller number of chip pins.

11 Claims, 5 Drawing Sheets

(51) Int. Cl.
  *G06F 1/22* (2006.01)
  *H01L 23/50* (2006.01)
  *H01L 23/00* (2006.01)

(52) U.S. Cl.
  CPC .......... *H03K 19/1732* (2013.01); *H01L 24/45* (2013.01); *H01L 2224/45144* (2013.01); *H01L 2224/45147* (2013.01); *H01L 2224/48644* (2013.01); *H01L 2224/48847* (2013.01); *H01L 2924/13055* (2013.01)

(56) References Cited

U.S. PATENT DOCUMENTS

| | | |
|---|---|---|
| 2007/0220191 A1 | 9/2007 | Gupta et al. |
| 2008/0079148 A1 | 4/2008 | Leung et al. |
| 2008/0158936 A1* | 7/2008 | Bertin .................. G11C 13/003 365/148 |
| 2009/0166679 A1 | 7/2009 | Paternoster et al. |
| 2009/0189550 A1* | 7/2009 | Sun ...................... H02N 2/0075 318/51 |
| 2013/0193590 A1 | 8/2013 | Bartoli et al. |

OTHER PUBLICATIONS

English translation of Japanese application No. H03 201453 filed Sep. 3, 1991.

* cited by examiner

INTEGRATED CIRCUIT, AND MOTOR DEVICE INCLUDING THE SAME

CROSS REFERENCE TO RELATED APPLICATIONS

This non-provisional patent application claims priority under 35 U.S.C. § 119(a) from Patent Application No. 201810107234.4 filed in the People's Republic of China on Feb. 2, 2018.

FIELD OF THE INVENTION

This disclosure generally relates to integrated circuit (IC) technology, more particular, the present disclosure relates to IC package technology.

BACKGROUND OF THE INVENTION

A trend in the IC industry is to provide more features in a small pin count IC package, which saves space and reduces product size. Therefore, the pins of an IC are expected to be multiplexed with many functions. However, according to the limitations of some IC manufacturers designing products, the port of the analog IP (intellectual property core) is prohibited from directly hard-wired connecting the digital IP port. This leads to the problem that the number of chip pins is insufficient, and the analog IP port and digital IP port are incompatible when the designed integrated circuit bare die is to be packaged into a chip with a small number of chip pins.

SUMMARY OF THE INVENTION

An integrated circuit includes a bare die and a multiplexed pin, the multiplexed pin is electrically connected to first and second switch circuits, the first and second switch circuits are respectively connected to first and second circuit modules disposed on the bare die and control a connection between the first and second circuit modules and the multiplexed pin, the first and second switch circuits are connected to the multiplexed pin adopting one the following configurations:
  a. the first switch circuit is connected to a first die pad by a metal layer trace within the bare die, the second switch circuit is connected to a second die pad by a metal layer trace within the bare die, and the first and second die pads are connected to the multiplexed pin through a bond wire respectively;
  b. the first and second switch circuits are connected to a multiplexed dies pad through a metal layer trace within the bare die respectively, and the multiplexed die pad is connected to the multiplexed pin by a bond wire.

Preferably, the metal layer trace is located in a plurality of structural layers within the bare die, and the bond wire is a gold wire or a copper wire.

Preferably, the bare die includes an analog region and a digital region, and the first die pad is an analog region die pad connected to the circuit module of the analog region, and the second die pad is a digital region die pad connected to the circuit module of the digital region.

Preferably, after the integrated circuit is powered on, during initialization process of the integrated circuit, the switch circuit is turned on or off according to a set value of a user configuration bit in a register; or the switch circuit is turned on or off in real time according to the set value of the user configuration bit in the register set by a user program during operation.

Preferably, the bare die includes a central processing unit and a switch control circuit, and the on and off states of the first and second switch circuits are controlled by the central processing unit or the switch control circuit.

Preferably, the switch circuit includes two electronic switches connected in a reverse parallel and an inverter, wherein the two electronic switches are respectively high and low active switches, a control end of one of the electronic switches is connected to a control end of the other electronic switch via the inverter, and nodes between the two electronic switches are respectively connected to the circuit module and the die pad.

Preferably, the switch circuit further comprises a buffer, and the control end of the one of the electronic switches receives the control signal through the buffer.

Preferably, anytime only one of the first and second switch circuits connected to the multiplexed pin is turned on.

Preferably, the integrated circuit includes 8, 16 or 20 chip pins, and the bare die includes 44, 48 or 68 die pads.

Preferably, the central processor has a bit width of 8 bits, 16 bits, and a maximum operating frequency is equal to or greater than 80 MHz.

An electrical machine includes the above described integrated circuit and a motor driven by the integrated circuit.

In embodiments of the present disclosure, a plurality of multiplexed pins may be disposed in an integrated circuit according to design requirements, so that a bare die with a larger number of die pads can be packaged in an integrated circuit with a smaller number of chip pins, which can reduce the number of chip pins and reduce the size and cost of the leadframe package.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
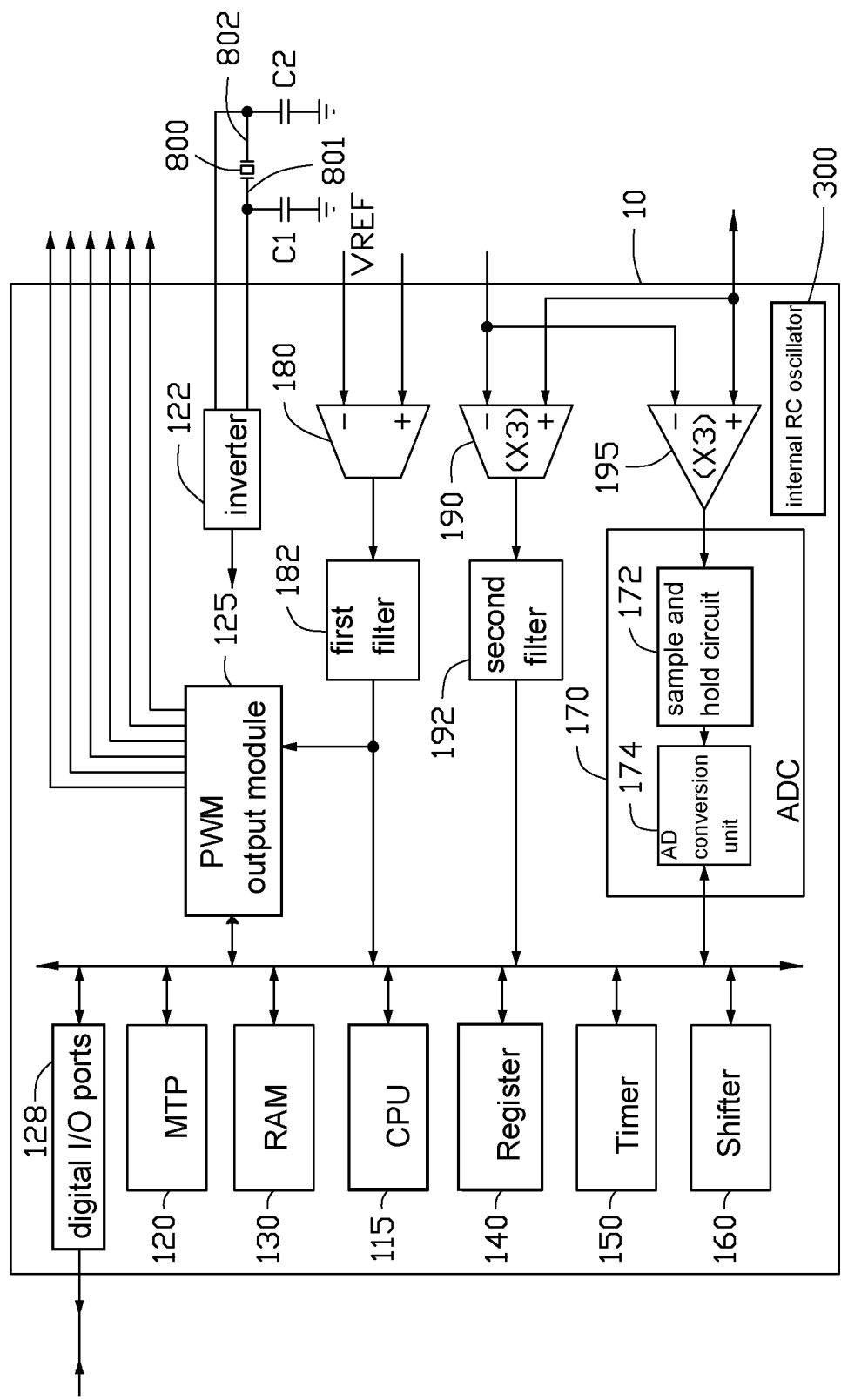
FIG. 1 is a functional block diagram of an integrated circuit in accordance with an embodiment of the present disclosure.

Various embodiments of the present disclosure will be described with reference to the drawings. It is understood that the drawings are for the purpose of illustration and description, The dimensions shown in the drawings are merely for the purpose of clarity and description, and are not intended to limit the scope of the disclosure. The described embodiments are only a part of the embodiments of the invention, and not all of the embodiments. All other embodiments obtained by those skilled in the art based on the embodiments of the present disclosure without creative efforts are within the scope of the present disclosure. Unless otherwise defined, all technical and scientific terms used herein have the same meaning as commonly understood by one of ordinary skill in the art to which this invention belongs.

Figure 2:
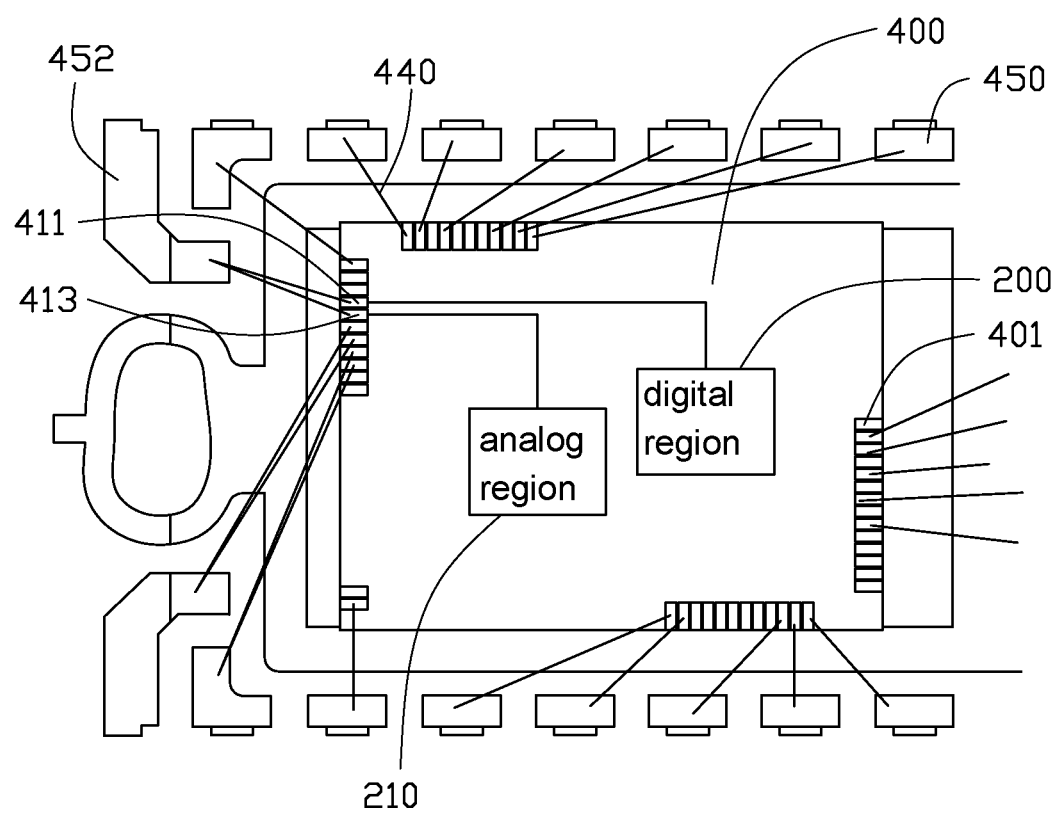
FIG. 2 is a schematic view of a leadframe of the integrated circuit of FIG. 1.

FIG. 1 and FIG. 2 are schematic diagrams of an integrated circuit 10 according to an embodiment of the present disclosure. The integrated circuit 10 of the present disclosure refers to an integrated circuit component, and specifically, can be a mixed signal single chip microcomputer. The integrated circuit 10 includes a housing, a bare die 400 (refer to FIG. 2) disposed within the housing, and a plurality of chip pins 450 extending outwardly from the housing. The bare die 400 is provided with a plurality of circuit modules, and the circuit modules include central processing unit (CPU) 115, random access memory (RAM) 130, multi-time programmable memory (MTP) 120, timer 150, shifter 160, PWM output module 125, comparators 180 and 190, operational amplifier 195, first filter 182, second filter 192, analog to digital converter (ADC) 170, digital I/O ports 128, inverter 122, and internal RC oscillator 300, etc. In this embodiment, the CPU 115 is an 8-bit single-chip microcomputer, and the operating frequency of the single-chip microcomputer can reach 80 MHz. Preferably, the integrated circuit is fabricated using a 0.15 micron semiconductor process. With this process, a higher system clock frequency, up to 80 MHz, can be achieved, and the bare die area can be reduced to 8-9 mm$^2$. The CPU 115 is connected to the RAM 130, the MTP 120, the shifter 160, the timer 150, the PWM output module 125, the digital I/O ports 128, the first filter 182, the second filter 192, and the ADC 170 through bus. In other embodiments, the CPU may have a bit width (data path width) of 8 bits, 16 bits or higher, and the highest operating frequency may be greater than or equal to 80 MHz.

The CPU 115 is a control center of the entire integrated circuit 10, and the RAM 130 is configured to temporarily store operation data of the CPU 115, running program or the like. The MTP 120 stores configuration information of an electronic device such as a motor device having the integrated circuit 10, and a driver program when the motor device is in operation.

The comparators 180, 190 are configured to compare an input signal to a reference value and then output a result, such as a logic one or a logic zero. The operational amplifier 195 is configured for amplifying an input signal and then outputting an amplified signal. The digital I/O ports 128 has three functions, the first function is to connect with an external circuit for data interaction, the second function is to drive peripherals or to increase the drive current without using a transistor, and the third function is to detect external events from peripherals. An output of the comparator 180 is connected to the CPU 115 via the first filter 182, and preferably also to the PWM output module 125. The output of the comparator 190 is connected to the CPU 115 via the second filter 192. An output of the operational amplifier 195 is connected to the ADC 170. The ADC 170 includes a sample and hold circuit 172 and an analog to digital (AD) conversion unit 174. The inverter 122, an external crystal resonator 800, capacitors C1, C2 and the internal RC oscillator 300 are configured to provide clock signals. The inverter 122 is connected to the external quartz crystal resonator 800, and two terminals 801 and 802 of the external crystal resonator 800 are electrically connected to the two terminals 122A and 122B (see FIG. 4) of the inverter 122 and the capacitors C1 and C2.

The integrated circuit 10 is a mixed-signal integrated circuit that has both analog circuits and digital circuits on a single semiconductor die and is capable of high frequency data processing. The CPU 115, RAM 130, MTP 120, timer 150, shifter 160, PWM output module 125, first filter 182, and second filter 192 or the like are located in a digital region 200, and the comparators 180, 190, the operational amplifier 195, the internal RC oscillator 300, and the like are located in an analog region 210.

Referring to FIG. 2, the bare die 400 has a rectangular shape with a plurality of die pads 401 disposed on a periphery thereof, and the die pads 401 are disposed on a surface of the bare die 400. It can be understood that in other embodiments, the bare die 400 is not limited to the rectangle shape, and may be other shapes. The die pad 401 is also referred to as an input/output pad or an I/O pad. Generally, these die pads 401 include power pads, ground pads, and data pads, and the like. The die pads 401 are electrically connected to corresponding chip pins 450 of a leadframe of the integrated circuit 10 by bond wires (also known as gold wires or copper wires) 440. In the present embodiment, the die pad connected to the digital region 200 is referred to as digital region die pad, and the die pad connected to the analog region 210 is referred to as analog region die pad.

In the embodiment of the present disclosure, one chip pin is connected to die pads on the analog region and the digital region can be realized, which will now be described with reference to the illustrated examples. In the present embodiment, the chip pin that simultaneously connects two or more die pads is referred to as a multiplexed pin.

Figure 3:
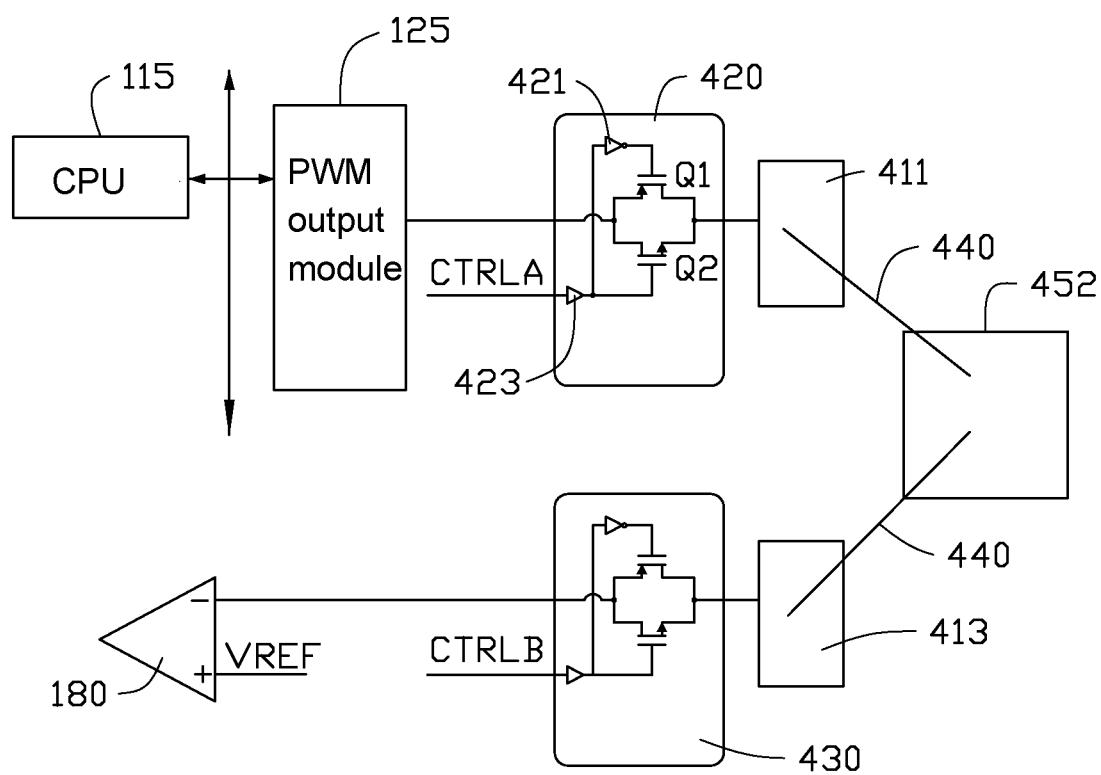
FIG. 3 is a detailed circuit diagram of a first embodiment of the present disclosure showing a digital region die pad and an analog region die pad sharing a chip pin of the integrated circuit.

Referring to FIG. 2 and FIG. 3 together, two die pads and a multiplexed pin are shown in FIG. 3, the two die pads are denoted as 411 and 413, respectively, and the multiplexed pins are denoted as 452. In this example, the die pad 411 is a digital region die pad, the die pad 413 is an analog region die pad. The digital region die pad 411 is connected to the digital region 200, such as a port connected to the PWM output module 125, through a first switch circuit 420. The analog region die pad 413 is connected to the analog region 210 of the integrated circuit 10, such as to an inverting input of the comparator 180, through a second switch circuit 430. The digital region die pad 411 and the analog region die pad 413 are respectively connected to the multiplexed pin 452 through a connection line 440, and the on and off states of the first and second switch circuits 420 and 430 are controlled by the CPU 115 or a switch control circuit controlled by the CPU 115. And at the same time, only one of the first and second switch circuits 420, 430 is turned on, that is, the multiplexed pin 452 can only transmit signals to one die pad at the same time to avoid messing up the operation of the integrated circuit 10.

Preferably, the first and second switch circuits 420 and 430 have the same circuit configuration, and both include two electronic switches connected in reverse parallel and an inverter 421. Preferably, a buffer 423 is further included in the switch circuit. In this embodiment, the two electronic switches include a PMOS transistor Q1 and an NMOS transistor Q2. A drain of the PMOS transistor Q1 is connected to a source of the NMOS transistor Q2, and a source of the PMOS transistor Q1 is connected to a drain of the NMOS transistor Q2, a gate of the PMOS transistor Q1 is connected to a gate of the NMOS transistor Q2 through an inverter 421. A connection node of the drain of the PMOS transistor Q1 and the source of the NMOS transistor Q2 acts as a first end of the switch circuit, a connection node of the source of the PMOS transistor Q1 and the drain of the NMOS transistor Q2 acts as the second end of the switch circuit. The gate of the NMOS transistor Q2 also receives a control signal output by the CPU 115 through the buffer 423, and the buffer 423 can be configured to increase the current value. Specifically, the first end of the first switch circuit 420 is connected to the digital region die pad 411, and the second end of the first switch circuit 420 is connected to a port of the PWM output module 125. The switch circuit 420 receives a control signal CTRLA output by the CPU 115. The first end of the second switch circuit 430 is connected to the analog region die pad 413, and the second end of the second switch circuit 430 is connected to the inverting input end of the comparator 180, the second switch circuit 430 receives a control signal CTRLB output by the CPU 115. When the control signals CTRLA and CTRLB output by the CPU 115 are at a high level, the NMOS transistor Q2 and the PMOS transistor Q1 are turned on, and the switch circuit is turned on; when the control signal output by the CPU 115 are at a low level, the NMOS transistor Q2 and the PMOS transistor Q1 are turned off, and the switch circuit is turned off. In other embodiments, the switch circuit can be a bidirectional controllable switch, such as include IGBT, GTR, GTO, BJT, or single phase thyristor.

After the integrated circuit 10 is powered on, during the initialization process, according to a set value of a user configuration bit in a register of the CPU, the switch circuit is thereby switched on or off to connect the multiplexed pin 452 to a corresponding circuit module. In other embodiments, during the operation of the integrated circuit 10, the switch circuit can be switched on or off in real time according to the set value of the user configuration bit in the register set by a program of the integrated circuit.

When the multiplexed pin 452 is configured to transmit a digital signal, that is, the multiplexed pin 452 is set to a digital pin, the control signal CTRLA output by the CPU 115 is at a high level, and the control signal CTRLB is at a low level. The first switch circuit 420 receives a high level control signal CTRLA, and the NMOS transistor Q2 and the PMOS transistor Q1 are turned on, thus a path between the multiplexed pin 452 and the digital region 200 is established through the turned on switch circuit 420. The second switch circuit 430 receives the low level control signal CTRLB, the NMOS transistor Q2 and the PMOS transistor Q1 are turned off, and the signal path between the multiplexed pin 452 and the analog region 210 is turned off, and the digital region 200 and the analog region 210 are isolated.

Similarly, when the multiplexed pin 452 is configured to transmit an analog signal, that is, it is set as an analog pin, the control signal CTRLA output by the CPU 115 is at a low level, and the control signal CTRLB is a high level. The first switch circuit 420 receives the low level control signal CTRLA, and the NMOS transistor Q2 and the PMOS transistor Q1 are turned off, and the signal path between the multiplexed pin 452 and the digital region 200 is turned off. The second switch circuit 430 receives the high level control signal CTRLB, and the NMOS transistor Q2 and the PMOS transistor Q1 are turned on, and the signal path between the multiplexed pin 452 and the analog region 210 is established through the turned on second switch circuit 430. In this embodiment, the multiplexed pin is used to transmit data. It can be understood that in other embodiments, the multiplexed pin may also be a power pin or a ground pin. The electronic switches in the first and second switch circuits 420 and 430 are connected in reverse parallel to enable bidirectional data transmission. A multiplexed pin is not limited to connect only two die pads. It is also possible to connect three or more die pads. At the same time, only one of the switch circuits connected to the same multiplexed pin is turned on. Moreover, an integrated circuit can include more than one multiplexed pins.

Figure 4:
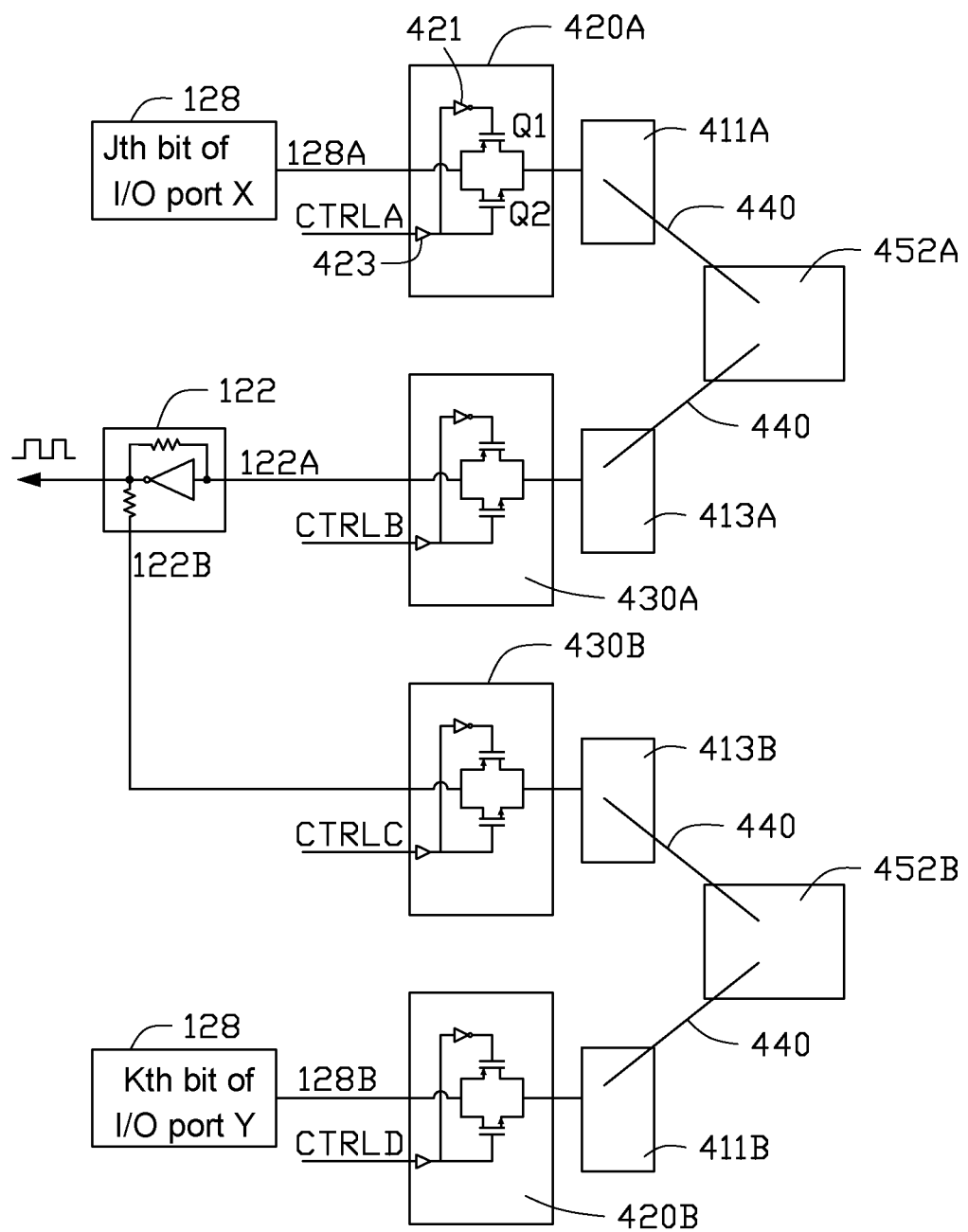
FIG. 4 is a detailed circuit diagram of a second embodiment of the present disclosure.

FIG. 4 is a detailed circuit diagram of a second embodiment of the present disclosure. In this embodiment, two digital region die pads 411A, 411B, two analog region die pads 413A, 413B, and first to fourth switch circuits are shown. The digital region die pad 411A is connected to the digital region 200 of the integrated circuit 10 (such as Jth bit 128A of an I/O port X) through the first switch circuit 420A. The digital region die pad 411B is connected to Kth bit 128B of an I/O port Y through the third switch circuit 420B. The analog region die pad 413A is connected to the analog region (such as the first terminal 122A of the inverter 122) through the second switch circuit 430A. The analog region die pad 413B is connected to a second end 122B of the inverter 122 through the fourth switch circuit 430B. The digital region die pad 411A and the analog region die pad 413A are connected to a multiplexed pin 452A respectively through a connection line 440. The digital region die pad 411B and the analog region die pad 413B are connected to a multiplexed pin 452B respectively through a connection line 440. The on and off states of the first to fourth switch circuits 420A, 430A, 420B, and 430B are respectively controlled by control signals CTRLA, CTRLB, CTRLC, CTRLD output by the switch control circuit or CPU. When the multiplexed pins 452A, 452B are respectively connected to the two ends 801 and 802 of the external crystal resonator 800, the second and fourth switch circuits 430A and 430B are controlled to be turned on, the first and third switch circuits 420A and 420B are turned off; when the multiplexed pins transmit data to or from the digital I/O port module 128, the first and third switch circuits 420A and 420B are controlled to be turned on, the second and fourth switch circuits 430A and 430B are turned off.

Figure 5:
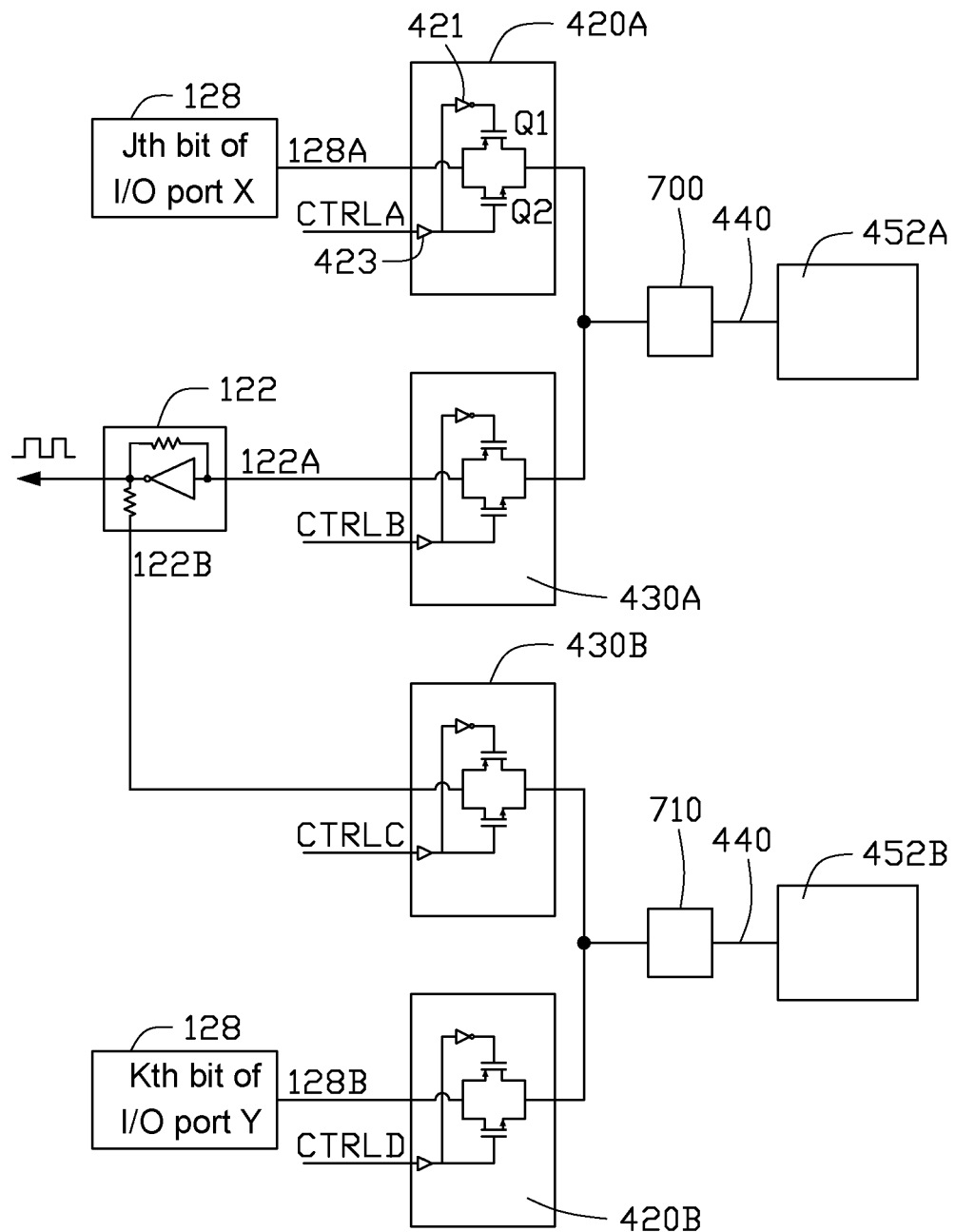
FIG. 5 is a detailed circuit diagram according to a third embodiment of the present disclosure.

FIG. 5 is a detailed circuit diagram of a third embodiment of the present disclosure. This embodiment is similar to the second embodiment except that in the embodiment, the first and second switch circuits 420A and 430A are respectively connected to a multiplexed die pad 700 through a metal layer trace within the bare die. The multiplexed die pad 700 is connected to the multiplexed pin 452A through a connection line 440, and the third and fourth switch circuits 420B and 430B are respectively connected to a multiplexed die pad 710 through a metal layer trace within the bare die, the multiplexed die pad 710 is connected to the multiplexed pin 452B through a connection line 440. In this embodiment, the multiplexed die pad is connected to at least two switch circuits by metal layer trace within the bare die, so that the multiplexed die pad is connected to the multiplexed pin through only one connection line, rather than through multiple connection lines, thereby reducing the number of the bond wires and improving the reliability of the integrated circuit, because if the IC works in a severely vibrating environment, the more connection lines are used, the worse the reliability of the integrated circuit. The metal layer trace can be located in a plurality of structural layers within the bare die.

In the embodiments of the present disclosure, a plurality of multiplexed pins may be disposed in the integrated circuit 10 according to design requirements, and when the multiplexed pins are set as digital pins or analog pins, the corresponding switch circuits connected the selected digital region die pad or the analog region die pad are turned on. In this way, the bare die with a larger number of die pads can be packaged in an integrated circuit with a smaller number of chip pins, which can reduce the number of pins and the size and cost of the leadframe package. In the embodiments of the present disclosure, two dies pads sharing the multiplexed pin may be disposed adjacent to each other, so that the connection lines are not crossed, which is easier to package, and the packaging difficulty is reduced accordingly. In accordance with embodiments of the present disclosure, a bare die having, for example, 44, 48, 68 die pads may be packaged into an integrated circuit having, for example, 8, 16, 20 chip pins.

The integrated circuit of the embodiments of the present disclosure can be applied to various products such as home appliances, medical equipment, and vehicles. An integrated circuit such as an embodiment of the present disclosure can be used to drive a motor of an applied device. The motor may be a three-phase brushless direct current motor (BLDC) or a permanent magnet synchronous motor (PMSM), including a stator and a rotor rotatable relative to the stator, the stator having a stator core and stator windings wound around the stator core. The stator core can be made of soft magnetic materials such as pure iron, cast iron, cast steel, electrical steel, and silicon steel. The motor may further include a motor inverter and position sensors for detecting magnetic field of the rotor, magnetic pole detection signals output by the position sensors are transmitted to the comparator 185 of the integrated circuit, and the comparator 185 processes the magnetic pole detection signals. After the magnetic pole detection signals are transmitted to the CPU 115 through the second filter 192, the CPU 115 outputs driving signals to the PWM output module 125 for driving electronic switches in the motor inverter to control commutation of the motor.

The above is only the preferred embodiments of the present disclosure, and is not intended to limit the present disclosure. Any modifications, equivalent substitutions and improvements made within the spirit and principles of the present disclosure should be included in the scope of the protection of the present invention.

The invention claimed is:

1. An integrated circuit comprising a bare die and a multiplexed pin, the multiplexed pin electrically connected to first and second switch circuits, the first and second switch circuits respectively connected to first and second circuit modules disposed on the bare die and controlling a connection between the first and second circuit modules and the multiplexed pin,
the first switch circuit being connected to a first die pad by a metal layer trace within the bare die, the second switch circuit being connected to a second die pad by a metal layer trace within the bare die, and the first and second die pads connected to the multiplexed pin through a bond wire respectively.

2. The integrated circuit of claim 1, wherein the metal layer trace is located in a plurality of structural layers within the bare die, and the bond wire is a gold wire or a copper wire.

3. The integrated circuit of claim 1, wherein the bare die comprises an analog region and a digital region, and the first die pad is a digital region die pad connected to the circuit module of the digital region, and the second die pad is an analog region die pad connected to the circuit module of the analog region.

4. The integrated circuit of claim 1, wherein after the integrated circuit is powered on, during initialization process of the integrated circuit, the first and second switch circuits are turned on or off according to a set value of a user configuration bit in a register, and each of the first and second switch circuits enables bidirectional data transmission.

5. The integrated circuit of claim 1, wherein the bare die comprises a central processing unit and a switch control circuit, and the on and off states of the first and second switch circuits are controlled by the central processing unit or the switch control circuit.

6. The integrated circuit of claim 1, wherein each of the first and second switch circuits comprises two electronic switches connected in a reverse parallel and an inverter, wherein the two electronic switches are respectively high and low active switches, a control end of one of the electronic switches is connected to a control end of the other electronic switch via the inverter, and nodes between the two electronic switches are respectively connected to the circuit module and the die pad.

7. The integrated circuit of claim 6, wherein each of the first and second switch circuits further comprises a buffer, and the control end of the one of the electronic switches receives the control signal through the buffer.

8. The integrated circuit of claim 1, wherein anytime only one of the first and second switch circuits connected to the multiplexed pin is turned on.

9. The integrated circuit of claim 1, wherein the integrated circuit comprises 8, 16 or 20 chip pins and the bare die comprises 44, 48 or 68 die pads.

10. The integrated circuit of claim 5, wherein the central processing unit has a bit width of 8 bits, 16 bits, and a maximum operating frequency is equal to or greater than 80 MHz.

11. A motor device comprising the integrated circuit of claim 1 and a motor driven by the integrated circuit.

* * * * *